US008871618B2

(12) United States Patent  
Xia et al.

(10) Patent No.: US 8,871,618 B2  
(45) Date of Patent: Oct. 28, 2014

(54) IN-SITU FABRICATION METHOD FOR SILICON SOLAR CELL

(75) Inventors: Yang Xia, Beijing (CN); Bangwu Liu, Beijing (CN); Chaobo Li, Beijing (CN); Jie Liu, Beijing (CN); Minggang Wang, Beijing (CN); Yongtao Li, Beijing (CN)

(73) Assignee: The Institute of Microelectronics of Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/699,739

(22) PCT Filed: Sep. 8, 2010

(86) PCT No.: PCT/CN2010/076716  
§ 371 (c)(1),  
(2), (4) Date: Nov. 25, 2012

(87) PCT Pub. No.: WO2012/031388  
PCT Pub. Date: Mar. 15, 2012

(65) Prior Publication Data  
US 2013/0071965 A1 Mar. 21, 2013

(30) Foreign Application Priority Data  
Sep. 7, 2010 (CN) .......................... 2010 1 0274489

(51) Int. Cl.  
    *H01L 21/26* (2006.01)  
    *H01L 31/18* (2006.01)  
    *C23C 14/48* (2006.01)  
    *H01L 21/223* (2006.01)

(52) U.S. Cl.  
    CPC ............ *H01L 31/18* (2013.01); *H01L 31/1804* (2013.01); *Y02E 10/547* (2013.01); *C23C 14/48* (2013.01); *H01L 21/2236* (2013.01)

USPC ............................................ 438/513; 438/88

(58) Field of Classification Search  
USPC ...................................... 438/513, 88  
See application file for complete search history.

(56) References Cited

U.S. PATENT DOCUMENTS

2010/0124799 A1 5/2010 Blake et al.  
2011/0303265 A1* 12/2011 Yuan et al. ............... 136/252

FOREIGN PATENT DOCUMENTS

| CN | 101789462 A | 7/2010 |
|---|---|---|
| CN | 101789466 A | 7/2010 |
| CN | 101807616 A | 8/2010 |

OTHER PUBLICATIONS

"Black silicon—new functionalities in microsystems" to M Stubenrauch et al. 2006 J. Micromech. Microeng. 16 S82 doi:10.1088/0960-1317/16/6/S13.*

*Primary Examiner* — Allen Parker  
(74) *Attorney, Agent, or Firm* — Cheng-Ju Chiang

(57) ABSTRACT

An in-situ fabrication method for a silicon solar cell includes the following steps: pretreating a silicon chip; placing the pretreated silicon chip in an implantation chamber of a plasma immersion ion implantation machine; completing the preparation of black silicon via a plasma immersion ion implantation process; making a PN junction and forming a passivation layer on the black silicon; after making the PN junction and forming the passivation layer, removing the black silicon from the plasma immersion ion implantation machine; preparing a metal back electrode on the back of the black silicon; preparing a metal grid on the passivation layer; obtaining a solar cell after encapsulation. Said method enables black silicon preparation, PN junction preparation, and passivation layer formation in-situ, greatly reducing the amount of equipment needed for the preparation of solar cells and the preparation cost. In addition, the method is simple and easy to control.

10 Claims, 5 Drawing Sheets

IN-SITU FABRICATION METHOD FOR SILICON SOLAR CELL

CROSS REFERENCE TO RELATED APPLICATIONS

The present application is a 35 U.S.C. §371 National Phase conversion of International (PCT) Patent Application No. PCT/CN2010/076716, filed on Sep. 8, 2010, the disclosure of which is incorporated by reference herein. The PCT International Patent Application was published in Chinese.

TECHNICAL FIELD

The present invention relates to the field of solar cell device fabrication technology, particularly to an in-situ fabrication method for silicon solar cell.

BACKGROUND OF THE INVENTION

Facing to the environmental problems such as greenhouse effect, acid rain and other ones caused by current energy crisis and mass cost of chemic fuel, it is urgent to develop and utilize new energy efficiently worldwide. Solar energy is a kind of reproducible energy which is easily obtained and green. It will become the main body of the worldwide energy supply before long. Solar cell, regarded as clean and efficient green continuable energy, will provide broader prospects for the efficient use of solar energy. So the research of improving the photoelectric concentration efficiency must be of significance in application and has prospects of development.

Currently, the method of fabricating silicon solar cell with prior art is shown in FIG. 1.

Pre-treating the silicon wafer at first (Step 101); then carrying on graphic, flocking process or fabricating black silicon (Step 102) to reduce the incident light reflectance; and after that, doping silicon wafers with chalcogenide elements (Sulfur: S, Selenium: Se, Tellurium: Te) to increase infrared absorptivity of silicon (Step 103); later, doping P (phosphorus), As (arsenic) or B (Boron) into the silicon wafer to form PN junction (Step 104); later, passivating the silicon wafer to reduce surface damage (Step 105); later, fabricating gate electrode and back electrode, thereby solar cell fabricating is achieved (Step 106); and later, packaging the solar cell into a device (Step 107).

In the fabrication method of solar cell above, procedures corresponding to step 101 to 107 need to be achieved in different devices, which make fabricating art of the solar cell be complicated and the controllability or art be worse. More importantly, the cost of the above method for solar cell is too high, therefore it cannot replace traditional energy, and large scale of solar application is limited.

SUMMARY OF THE INVENTION

The technical problem the present invention needs to resolve is to provide an in-situ fabrication method for solar cell. With this method, black silicon fabrication, PN junction production and passivation layer forming can be achieved in situ, thereby, devices needed to fabricate solar cell are reduced greatly, production cost of the solar cell decreases significantly, and the art process is simple and easy to control.

To solve the technical problems above, the present invention provides an in-situ fabrication method for solar cell. The method includes:

(a) pre-treating the silicon wafer;
(b) placing the pre-treated silicon wafer in the implantation chamber of the plasma immersion ion implantation device, where black silicon fabrication is achieved with plasma immersion ion implantation art, and producing PN junction and forming passivation layer on said black silicon;
(c) removing the black silicon on which producing PN junction and forming passivation layer have been achieved from the plasma immersion ion implantation device, then fabricating metal back electrode on the back of the black silicon, and fabricating metal electrode on the passivation layer, and solar cell is formed after packaged.

Furthermore, the present invention has the following features, that is, the step (b) includes further the following steps:

(b1) placing the silicon wafer in the implantation chamber of the plasma immersion ion implantation device and connecting silicon wafer with a power and electric which can apply bias voltage;

(b2) adjusting process parameters of said plasma immersion ion implantation device, said ions with etching effect and said ions with passivating effect are implanted into said silicon wafer to react with said silicon wafer, thereby the black silicon layer is formed;

(b3) keeping the black silicon in situ, and adjusting the process parameters of said plasma immersion ion implantation device again to achieve that plasma including miscellaneous ions is generated in the implantation chamber, then, doping ions are implanted into said black silicon, thereby the PN junction is formed;

(b4) keeping the black silicon formed in situ, and adjusting the process parameters of said plasma immersion ion implantation device again to achieve that plasma including passivating ions are generated in the implantation chamber, then passivating ions react with said black silicon, thereby the passivation layer is formed. Further, the present invention has the following features: Said process parameters include: base pressure and work pressure of said implantation chamber, flow of the gas implanted into said implantation chamber, speed of vacuuming said gas implanted into said implantation chamber, said gas component, composition ratio and concentration etc.; output power and frequency of said plasma source of said plasma immersion ion implantation device, bias voltage applied by the power source and implanting time of the plasma.

Further, the present invention has the following features: said bias voltage is composed of a variety of bias voltages, the concentration of the doping ions implanted into said black silicon is changed by adjusting implanting time of the plasma, flow and composition ratio of the gas implanted and output power of said bias voltage of said plasma power source.

Further, this invention has the following features, said step (b2) includes the following steps:

vacuuming the gas implanted into the implantation chamber to reach the pre-set base pressure range of $10^{-7}$ pa to 1000 pa;

implanting process gas which includes gas with etching effect and passivating effect into said implantation chamber, and adjusting the flow and composition ratio of the implanted gas to make the pressure of said implantation chamber reach the pre-set base pressure range of $10^{-3}$ pa to 1000 pa;

adjusting implanting time of said plasma, output power of said plasma power or said bias voltage into the range set beforehand, and plasma including ions with etching effect and passivating effect is generated in said implantation chamber; the etching ions and passivating ions are implanted into said silicon wafer and react with said silicon wafer to form black silicon; where said plasma implanting time is 1 minute to 30 minutes, and the output power range set beforehand is 1~100000 W, and said bias voltage range set beforehand is −100000~100000V.

Further, the present invention includes the following features: flow of said process gas is 1 sccm~1000 sccm; said gas with etching effect includes $SF_6$, $CF_4$, $CHF_3$, $C_4F_8$, $NF_3$, $SiF_4$, $C_2F_6$, HF, $BF_3$, $PF_3$, $Cl_2$, HCl, $SiH_2Cl_2$, $SiCl_4$, $BCl_3$ or HBr; and said gas with passivation effect includes: $O_2$, $N_2O$ or $N_2$; the volume ratio of the gas with etching effect and the gas with passivation effect is 0.01 to 100.

Further, the present invention has the following features, said step (b3) includes the following steps:

Stopping implanting said process gas into said implantation chamber, vacuuming all gas of said implantation chamber, and keeping said black silicon in situ;

Implanting process gas which includes gas containing doping element into said implantation chamber, and adjusting the implanted gas flow and said concentration of said gas containing doping element in said process gas to make the pressure of said implantation chamber reach the pre-set base pressure range of $10^{-3}$ pa to 1000 pa;

adjusting implanting time of said plasma, output power of said plasma power or said bias voltage into the range set beforehand, and generating plasma including doping ions in said implantation chamber, and implanting said doping ions including B ions, P ions or As ions into said black silicon to form PN junction; where implantation time is 1 minute to 30 minutes, and said output power range set beforehand is 1~100000 W, and said bias voltage range set beforehand is −100000~100000V.

Further, the present invention has the following features: said gas containing doping element includes $B_2H_6$, $B(OCH_3)_3$, $B_2O_3$, BN, $BCl_3$, $BBr_3$, $BF_3$, $PH_3$, $PCl_3$, $PBr_3$, $PF_3$, $PF_5$, $P_2O_5$, $POCl_3$, $AsH_3$, $AsCl_3$, $AsF_3$ or $AsF_5$; said process gas flow is 1 sccm~1000 sccm, and concentration of said gas containing doping element in said process gas is 0.01% to 100%.

Further, the present invention has the following features: said gas containing doping element also includes $H_2S$, $H_2Se$ or $H_2Te$; said doping ions include S ion, Se ion or Te ion.

Further, the present invention has the following feature, said step (b4) includes the following steps:

Stopping implanting said process gas into said implantation chamber, vacuuming all gas of said implantation chamber, and keeping said black silicon on which PN junction has been formed in situ;

Implanting process gas which includes gas with passivating effect into said implantation chamber, and adjusting the implanted gas flow to make the pressure of said implantation chamber reach the pre-set base pressure range of $10^{-3}$ pa to 1000 pa; adjusting implanting time of said plasma, output power of said plasma power or said bias voltage into the range set beforehand, and generating plasma including ions with passivating effect in said implantation chamber; and implanting said ions with passivating effect into said black silicon to form passivation layer; where implantation time is 1 minute to 30 minutes, and said output power range set beforehand is 1~100000 W, and said bias voltage range set beforehand is −100000~100000V.

Compared to conventional art, the present invention has following advantages:

1. With the in-situ fabrication method for solar cell provided by the present invention, black silicon fabrication, PN junction production and passivation layer forming can be achieved in situ, thereby, devices needed to fabricating solar cell are reduced greatly, production cost of the solar cell decreases significantly.

2. The art process of the in-situ fabrication method for solar cell provided by the present invention is simple and easy to control.

3. The in-situ fabrication method for solar cell provided by the present invention, doping chalcogenide elements, can enlarge black silicon absorption spectrum range, particularly expand the absorption spectrum of the black silicon to infrared region, and increase the infrared absorption rate of the black silicon, and thus increase photoelectric convention efficiency of solar cell.

DETAILED DESCRIPTION OF THE PRESENTLY PREFERRED EMBODIMENTS

Figure 1:
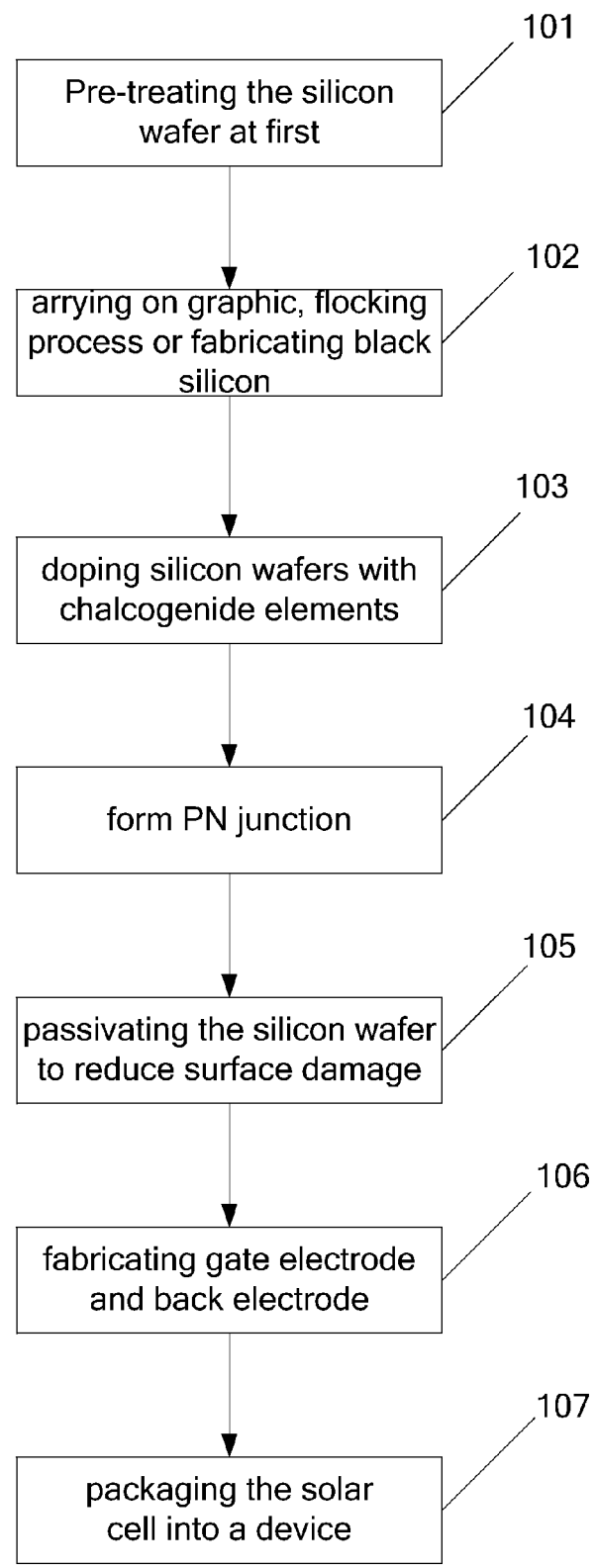
FIG. 1 is a process flow scheme of fabricating solar cell with prior art.

To further comprehend the following detailed description of the present invention, reference is made to the attached drawings and embodiments.

Plasma Immersion Ion Implantation (PIII in short), is also called plasma implantation, plasma doping, plasma immersion implantation, plasma source ion implantation, plasma base ion implantation and etc. The several names mean the same process technology, that is, sample to be implanted is immersed into plasma, and by applying bias voltage (also called "implantation voltage") to the sample, implantation sheath layer is formed between the sample and the plasma; reactive ions located on the implantation sheath layer electric field and reactive ions entering sheath layer electric field from the plasma are implanted into the sample under the speeding effect of electric field. Sheath layer is formed on the sample surface, so the sample surface exposed to the plasma will be implanted throughout.

In the present invention, plasma immersion ion implantation technology is utilized to achieve in-situ fabrication method for solar cell. The method can achieve all process except silicon wafer pretreatment, electrode production and package into components. The process includes: fabricating black silicon to reduce reflectivity of incident light; doping chalcogenide element to increase infrared absorptivity of the silicon wafer; producing PN junction and forming passivation layer, i.e. realizing in-situ fabricating solar cell.

The main steps of the present invention include: pre-treating silicon wafer, placing the silicon wafer pretreated in the implantation chamber of the plasma immersion ion implantation device, filling process gas with etching and passivating effect, adjusting process parameters of said plasma immersion ion implantation device into the range of value set beforehand, and accomplishing black silicon production; stopping filling gas, and vacuuming all gas in the chamber of the plasma immersion ion implantation device, keeping black silicon produced in situ, filling gas containing P, As or B element, adjusting process parameters of said plasma immersion ion implantation device into the range of value set beforehand, and accomplishing PN junction production; stopping filling gas, and vacuuming all gas in the chamber of the plasma immersion ion implantation device, keeping PN junction produced in situ, filling gas with passivation effect, adjusting process parameters of said plasma immersion ion implantation device into the range of value set beforehand, and accomplishing passivation, that is, forming passivation layer on the PN junction produced. Black silicon fabrication, PN junction production and passivation layer forming can be achieved in the same device, so there is no any process among them and there is no need to change device, thereby, the amount of device needed to fabricate solar cell is reduced greatly, production cost of the solar cell decreases significantly.

Besides, the present invention also includes the following steps: filling mixed gas containing chalcogenide element, adjusting process parameters of said plasma immersion ion implantation device into the range of value set beforehand, and accomplishing chalcogenide element doping of the black silicon.

The process parameters include: base pressure and work pressure of said implantation chamber; flow of the process gas implanted into implantation chamber, speed of vacuuming the process gas implanted into implantation chamber, the component, composition ratio and concentration of the process gas; output power and frequency of said plasma source of said plasma immersion ion implantation device, bias voltage applied by the power source which can apply bias voltage and implanting time of the plasma. The bias voltage is composed of a variety of bias voltage, concentration of the doping ions implanted into said black silicon is changed by adjusting implantation time of the plasma, flow and composition ratio of the gas implanted and output power of said bias voltage of said plasma power source.

The plasma immersion ion implantation device generally includes implantation chamber and plasma source. A sample stage on which samples can be put is placed in the implantation chamber, and plasma source is placed opposed to the sample stage. Plasma source includes vacuum system, which can vacuum the chamber to reach the pre-set base pressure range, gas supply system, which can implant the required gas in the chamber, and can adjust the parameter of the gas according to certain rules, such as gas flow, vacuum speed, gas composition ratio and concentration and etc., and make pressure of the chamber reach pre-set work pressure range after gas implanted into the chamber; and plasma power source, which can be RF power source, microwave power source or DC power source. These sources can supply power with pulse form, and the frequency of these sources can be fixed frequency or variable frequency.

Alternatively, the plasma immersion ion implantation device also includes power source which can apply bias voltage. The power source which can apply bias voltage is connected electrically with the sample stage. The type of the power source which can apply bias voltage is similar to that of the plasma power source, which can be RF power source, microwave power source or DC power source, which can supply power with pulse form, or random combination, and thus the sample stage can be applied with bias voltage comprised of multiple kind of bias voltage.

Alternatively, the plasma immersion ion implantation device also can include monitoring component monitoring all kinds of process condition inside the implantation chamber, such as electronic temperature, plasma density, plasma potential, ion mass distribution and emission spectrum and so on. The power of the plasma source and the power source supplying bias voltage can be adjusted according to certain rules. If supplying bias voltage in pulse form, the frequency, pulse width and duty cycle of the plasma source and power source supplying bias voltage can be adjusted according to certain rules. The power source supplying bias voltage can adjust its bias voltage according to certain rules.

In the following detailed description of embodiment included but not limited according to the present invention, reference is made to the attached drawings.

Figure 2:
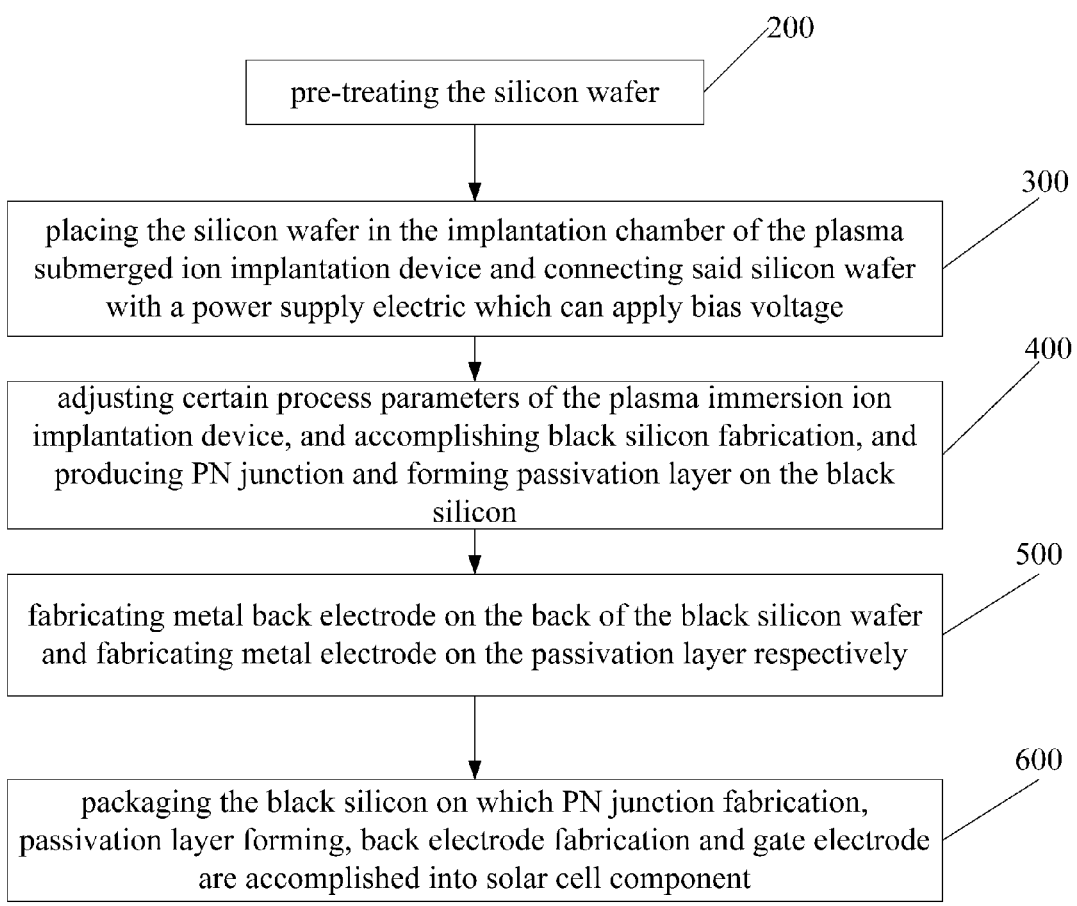
FIG. 2 is a flow scheme of in-situ fabricating solar cell method according to the present invention.

See FIG. 2, the embodiment according to the present invention supplying an embodiment to achieve in-situ fabrication method for solar cell with plasma immersion ion implantation technology, includes the following steps:

Step 200; pre-treating the silicon wafer;

Wherein the methods of pretreating the silicon wafer include process such as washing, polishing, annealing, corrosion, texturing (also called textured) and/or graphical and other processes, and the silicon wafer shape can be normal shape, like circle, square or rectangle and so on, and also it can be any complicated shape;

For example, the steps of silicon wafer washing generally include: First, submerging the silicon wafer into hydrofluoric acid solution for 1-10 minutes to be washed with deionized water, and then submerging the silicon wafer into sodium hydroxide solution with a concentration of 1%~30% and a temperature of 50-80° C. for 1-10 minutes, to remove damaged layer of the silicon layer; and at last, washing the monocrystalline silicon wafer with deionized water, and drying it with nitrogen gas;

Step 300: placing the silicon wafer in the implantation chamber of the plasma submerged ion implantation device and connecting said silicon wafer with a power supply electric which can apply bias voltage;

wherein, the silicon wafer is placed into the plasma immersion ion implantation device and on the sample stage; in some embodiments, the plasma immersion ion implantation device includes power source supplying bias voltage, now the silicon wafer can be connected electrically with the sample stage; the sample stage is connected electrically with the power source supplying bias voltage, so the silicon wafer can be connected electrically with the power source supplying bias voltage; in certain condition, starting the power source can supply bias voltage to the silicon wafer;

Step 400: adjusting certain process parameters of the plasma immersion ion implantation device, and accomplishing black silicon fabrication, and producing PN junction and forming passivation layer on the black silicon, and the detailed sub-step of step 400 is described below;

Step 500: fabricating metal back electrode on the back of the black silicon wafer and fabricating metal electrode on the passivation layer respectively; wherein fabricating metal Al back electrode on the back of the black silicon wafer, for example, high purity aluminum is utilized as the evaporation source, and aluminum metal with a thickness of 10 to 15 microns is deposited on the back of the monocrystalline silicon wafer. And then, in a protecting atmosphere, annealing is carried on for 20-40 minutes at a temperature of 350 to 450° C. to form an ohmic contact metal Al back electrode. In the present step, 350 to 450° C. annealing is carried on instead of high temperature sintering process, it can avoid damage to the monocrystalline silicon wafer caused by stress induced by high-temperature sintering process and help to reduce the thickness of monocrystalline silicon wafers; fabricating Ag gate electrode on the passivation layer; by silk screen printing method, that is, silver paste is printed on the surface of the passivation layer by special printer and template and Ag gate electrode is formed. The thickness of the gate electrode is 2-10 microns, the width of the gate electrode is 30-150 microns, and the distance is 2-3 millimeters.

Step 600: packaging the black silicon on which PN junction fabrication, passivation layer forming, back electrode fabrication and gate electrode are accomplished into solar cell component, whereby fabrication of the solar cell is accomplished.

Figure 3:
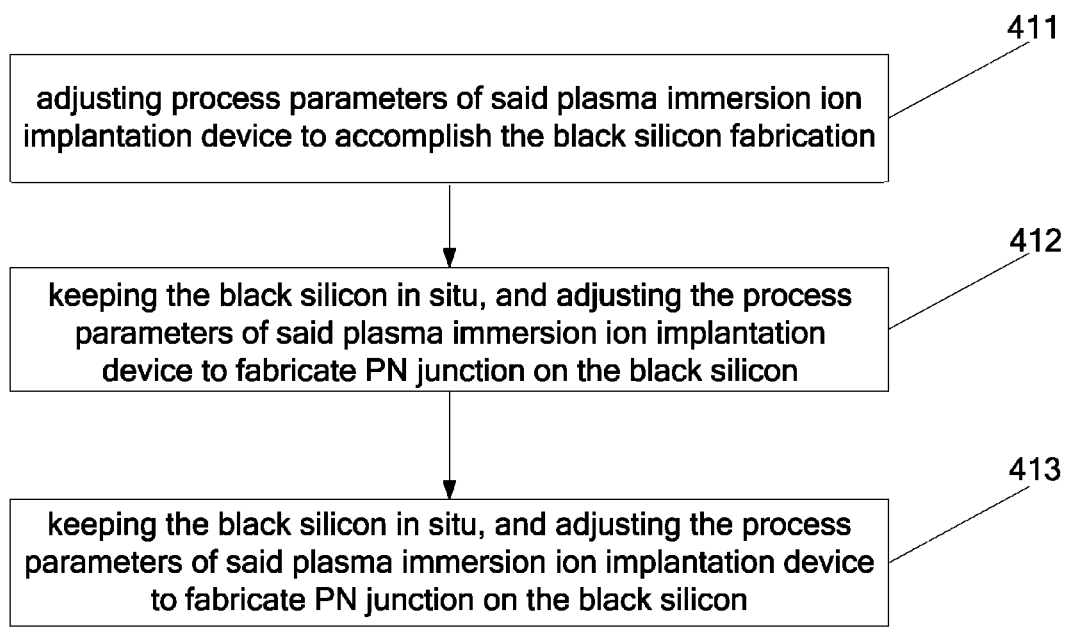
FIG. 3 is a flow scheme of the embodiment of step 400 in FIG. 2.

In one embodiment, said step 400 can be the process flow shown as the corresponding process step 411 to 413 in FIG. 3.

Step 411: adjusting process parameters of said plasma immersion ion implantation device to accomplish the black silicon fabrication, wherein, first, vacuum the gas implanted into the implantation chamber to reach the pre-set base pressure range of $10^{-7}$ pa to 1000 pa; then, implanting process gas which includes gas with etching effect and passivating effect into said implantation chamber, for example, said gas with etching effect includes $SF_6$, $CF_4$, $CHF_3$, $C_4F_8$, $NF_3$, $SiF_4$, $C_2F_6$, HF, $BF_3$, $PF_3$, $Cl_2$, HCl, $SiH_2Cl_2$, $SiCl_4$, $BCl_3$ or HBr, and said gas with passivation effect includes: $O_2$, $N_2O$ or $N_2$; adjusting the flow and volume ratio of the process gas to that the flow of the mixed gas is 1 to 1000 sccm and the volume ratio of the gas with etching effect and the gas with passivation effect is 0.01 to 100 to make the pressure of said implantation chamber reach the pre-set base pressure range of $10^{-3}$ pa to 1000 pa; adjusting implanting time of said plasma, output power of said plasma power or said bias voltage into the range set beforehand, where said plasma implanting time is 1 minute to 30 minutes, and said output power range set beforehand is 1~100000 W, and said bias voltage range set beforehand is −100000~100000V; and plasma including ions with etching effect and passivating effect is generated in said implantation chamber; and ions located on the implantation sheath layer electric field and reactive ions entering sheath layer electric field from the plasma are implanted into the silicon wafer under the speeding effect of sheath layer electric field between the silicon wafer and the plasma after the plasma has been produced and immersed the silicon wafer; for example, on the condition that the fixed gas is comprised of $SF_6$ and $O_2$, after ionization, $SF_6$ and $O_2$ generate F* group with etching effect and O* group with passivation respectively, wherein F* group react with Si to form $SiF_4$, and thus produce etching effect on Si; meanwhile, $Si_xO_yF_z$ is formed on the etching wall by the O* group to produce passivation effect; thereby, on the combined effect of etching and passivation, finally black silicon with shape of porous or mesh is formed;

Step 412: keeping the black silicon in situ, and adjusting the process parameters of said plasma immersion ion implantation device to fabricate PN junction on the black silicon; wherein, stopping implanting said process gas into said implantation chamber, vacuuming all gas of said implantation chamber, and keeping said black silicon in situ; and then implanting process gas which includes gas containing doping element (such as elements containing P, As or B.) into said implantation chamber, for example, gas containing doping element includes $B_2H_6$, $B(OCH_3)_3$, $B_2O_3$, BN, $BCl_3$, $BBr_3$, $BF_3$, $PH_3$, $PCl_3$, $PBr_3$, $PF_3$, $PF_5$, $P_2O_5$, $POCl_3$, $AsH_3$, $AsCl_3$, $AsF_3$ or $AsF_5$; adjusting the process gas flow and said concentration of said gas containing doping element in said process gas, to make the pressure of said implantation chamber reach the pre-set base pressure range of $10^{-3}$ pa to 1000 pa, wherein the process gas flow can be 1 sccm~1000 sccm, and concentration of said gas containing doping element in said process gas is 0.01% to 100%; then adjusting implanting time of said plasma, output power of said plasma power or said bias voltage into the range set beforehand, the implantation time is 1 minute to 30 minutes, and the output power range set beforehand is 1~100000 W, and the bias voltage range set beforehand is −100000~100000V; finally, generating plasma with doping ions in implantation chamber, for example the process gas containing P, As or B element is decomposed into ions or ions group with P, As or B element, then the doping ions or doping ions group speeded by bias voltage are implanted into the black silicon to fabricate PN junction.

Step 413: keeping the black silicon in situ, and adjusting the process parameters of said plasma immersion ion implantation device to fabricate PN junction on the black silicon; wherein, stopping implanting said process gas into said implantation chamber, vacuuming all gas of said implantation chamber, and keeping said black silicon where PN junction has been fabricated in situ; and implanting process gas with passivation effect into said implantation chamber, for example, gas with passivation effect includes $O_2$, $N_2O$ or $N_2$; adjusting the process gas flow to make the pressure of said implantation chamber reach the pre-set base pressure range of $10^{-3}$ pa to 1000 pa, wherein the process gas flow can be 1 sccm~1000 sccm, and then adjusting implanting time of said plasma, output power of said plasma power or said bias voltage into the range set beforehand, the implantation time is 1 minute to 30 minutes, and the output power range set beforehand is 1~100000 W, and the bias voltage range set beforehand is −100000~100000V; generating plasma with ions with passivation effect in implantation chamber, for example the process gas with passivation effect is decomposed into ions or ions group with passivation effect, then the ions or ions group speeded by bias voltage are implanted into the black silicon reacting with silicon wafer to fabricate passivation layer.

Figure 4:
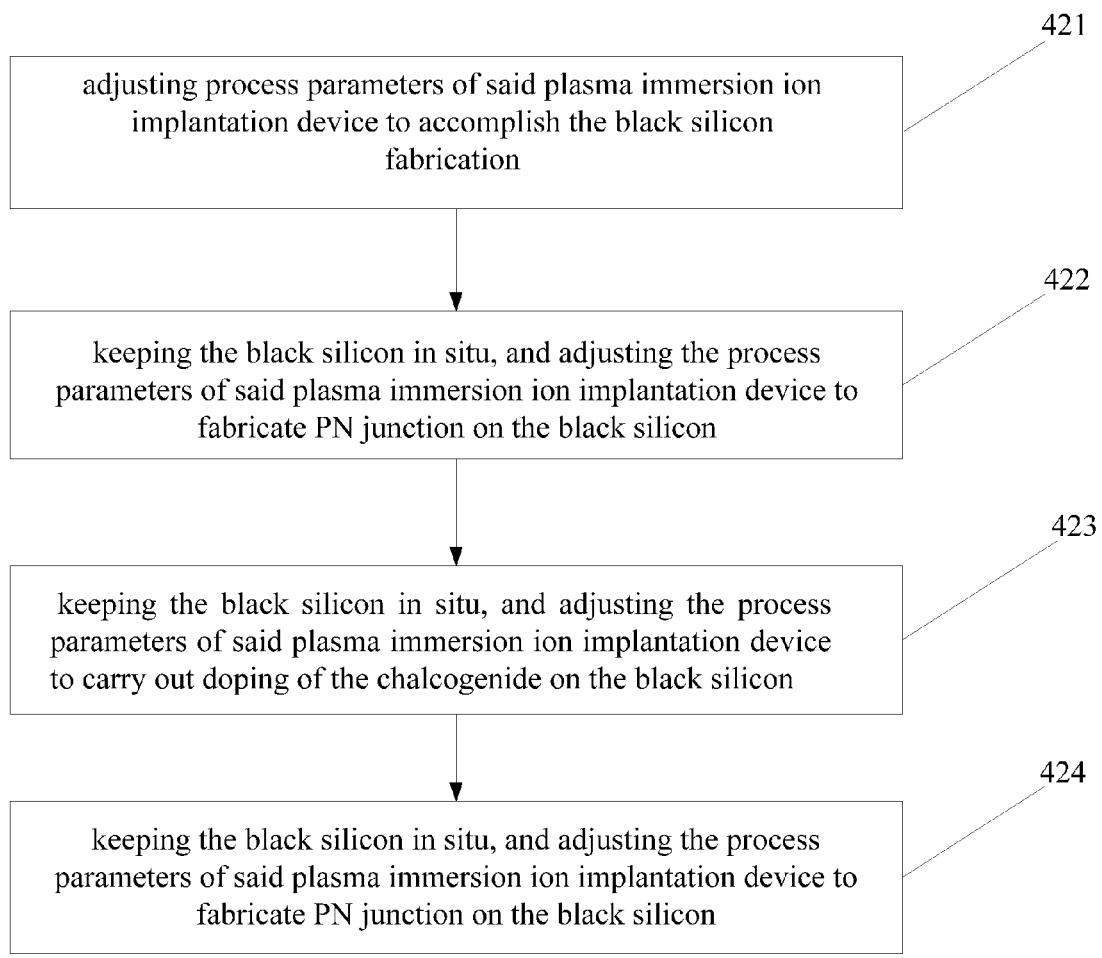
FIG. 4 is a flow scheme of another embodiment of step 400 in FIG. 2.

In another embodiment, said step 400 can be process flow as the corresponding process step 421 to 424 in FIG. 4, wherein step 411 in FIG. 3 is the same as step 421 in FIG. 4, step 412 in FIG. 3 is the same as step. 422 in FIG. 4, step 413 in FIG. 3 is the same as step 423 in FIG. 4, and step 423 is added in FIG. 4 on the basis of the steps in FIG. 3. Step 423: keeping the black silicon in situ, and adjusting the process parameters of said plasma immersion ion implantation device to carry out doping of the chalcogenide on the black silicon; wherein, stopping implanting said process gas into said implantation chamber, vacuuming all gas of said implantation chamber, and keeping said black silicon in situ; and implanting process gas (for example, elements containing S, Se or Te) with doping element into said implantation chamber, adjusting the process gas flow to make the pressure of said implantation chamber reach the pre-set base pressure range of $10^{-3}$ pa to 1000 pa, wherein the process gas flow can be 1 sccm~1000 sccm, and concentration of said gas containing doping element in said process gas is 0.01% to 100%; then adjusting implanting time of said plasma, output power of said plasma power or said bias voltage into the range set beforehand, the implantation time is 1 minute to 30 minutes, and the output power range set beforehand is 1~100000 W, and the bias voltage range set beforehand is −100000~100000V; finally, generating plasma with doping ions in implantation chamber, for example the process gas containing S, Se or Te element is decomposed into ions or ions group with S, Se or Te element, then the ions or ions group speeded by bias voltage are implanted into the black silicon to fabricate element doping (S, Se, Te) to the black silicon.

Figure 5:
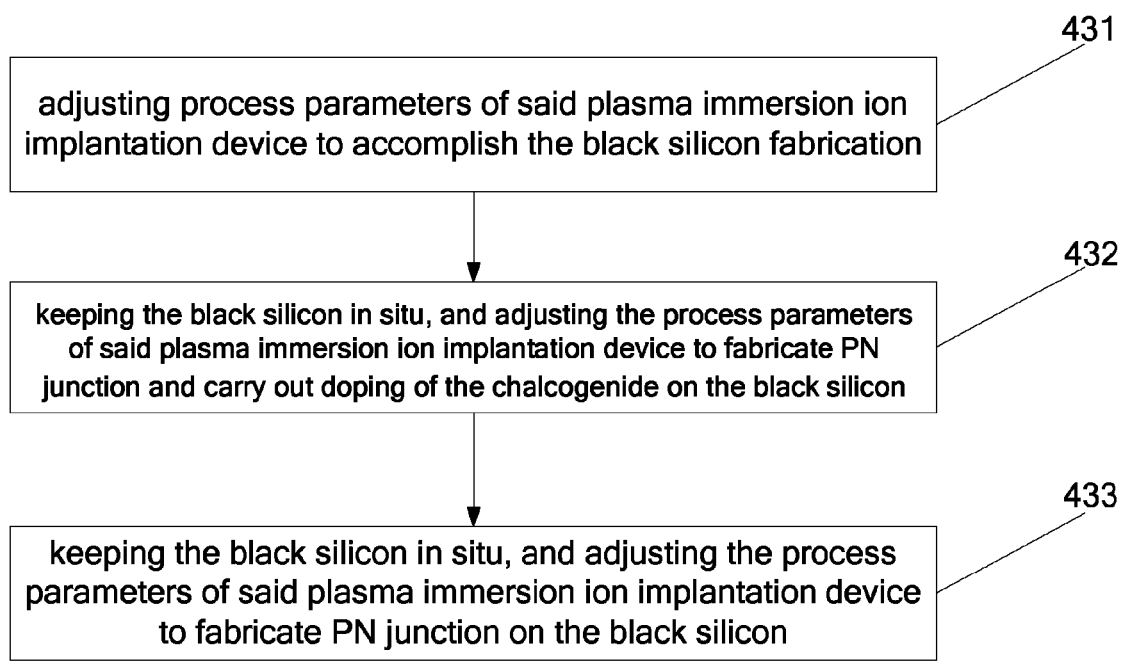
FIG. 5 is a flow scheme of another embodiment of step 400 in FIG. 2.

In another embodiment, said step 400 can be process flow as the corresponding process step 431 to 433 in FIG. 5, wherein step 411 in FIG. 3 is the same as step 431 in FIG. 5, step 413 in FIG. 3 is the same as step 433 in FIG. 4, and step 432 in FIG. 5 is added with chalcogenide doping on the basis of step 412 in FIG. 3.

Step 432: keeping the black silicon in situ, and adjusting the process parameters of said plasma immersion ion implantation device to fabricate PN junction and carry out doping of the chalcogenide on the black silicon; wherein, stopping implanting said process gas into said implantation chamber, vacuuming all gas of said implantation chamber, and keeping said black silicon where PN junction has been fabricated in situ; and implanting process gas (for example, mixed gas containing S, Se or Te, and process gas containing mixtures with P, As or B element) with doping element into said implantation chamber; wherein gas including P, As or B element can be $B_2H_6$, $B(OCH_3)_3$, $B_2O_3$, BN, $BCl_3$, $BBr_3$, $BF_3$, $PH_3$, $PCl_3$, $PBr_3$, $PF_3$, $PF_5$, $P_2O_5$, $POCl_3$, $AsH_3$, $AsCl_3$, $AsF_3$ or $AsF_5$, and gas containing S, Se or Te element can be $H_2S$, $H_2Se$ or $H_2Te$; adjusting the process gas flow to make the pressure of said implantation chamber reach the pre-set base pressure range of $10^{-3}$ pa to 1000 pa, wherein the process gas flow can be 1 sccm~1000 sccm, and concentration of said gas with doping element in said process gas is 0.01% to 100%; then adjusting implanting time of said plasma, output power of said plasma power or said bias voltage into the range set beforehand, the implantation time is 1 minute to 30 minutes, and the output power range set beforehand is 1~100000 W, and the bias voltage range set beforehand is −100000~100000V; finally, generating plasma with doping ions in implantation chamber, for example the process gas with P, As or B element is decomposed into ions or ions group with P, As or B element, and the process gas with S, Se or Te element is decomposed into ions or ions group with S, Se or Te element; and then the ions or ions group speeded by bias voltage are implanted into the black silicon to fabricate PN junction, and in the meanwhile accomplish sulfur elements doping (S, Se or Te) to the black silicon.

With respect to the process parameters of the plasma immersion ion implantation device, the base pressure of the implantation chamber can be $10^{-7}$ pa~1000 pa, preferably, $10^{-5}$ pa~10 pa, more preferably, $10^{-5}$ pa~$10^{-3}$ pa; the work pressure of the implantation chamber can be $10^{-3}$ pa~1000 pa, preferably, 0.01 pa~100 pa, more preferably, 0.1 pa~50 pa; The flow of the process gas is 1 to 1000 sccm, preferably 10 to 100 sccm, and more preferably 20 to 80 sccm. Output power of the plasma power source is 1 to 100000 W, preferably 10 to 50000 w, and more preferably 300 to 5000 W. the bias voltage applied is −100000 to 100000V, preferably −50000 to 50000V, and more preferably −10000 to 0V, and pulse width of which is 1 us to 1 s, preferably 1 us to 0.1 s, and more preferably 1 us to 1 ms, and duty cycle of which is 1% to 99%, preferably 10% to 90%, and more preferably 20% to 80%. Frequency of the plasma power source is DC to 10 GHz, preferably 1 MHz to 5 GHz, and more preferably 13.56 MHz to 5 GHz. Frequency of the power source which can supply bias voltage is DC to 10 GHz.

The purpose, technical program and beneficial effect of the present invention are described in detail through the embodiments said above. It should be noted that the above description is only the preferred embodiment, but not intended to limit the present invention. Any modification, equivalent replacement, improvement of the present invention should be deemed to fall into the protection scope of the present invention.

What is claimed is:

1. An in-situ fabrication method for solar cells, comprising the following steps:
   (a) pre-treating a silicon wafer;
   (b) placing the pre-treated silicon wafer in an implantation chamber of a plasma immersion ion implantation device, and further comprising steps of:
   forming black silicon on the pre-treated silicon wafer in situ by plasma immersion ion implantation;
   producing a PN junction on the black silicon in situ by plasma immersion ion implantation; and
   forming a passivation layer on said black silicon in situ by plasma immersion ion implantation; and
   (c) moving the silicon wafer having the black silicon formed, the PN junction produced and the passivation layer formed thereon out from the plasma immersion ion implantation device, and further comprising steps of:
   fabricating a metal back electrode on a back of the black silicon;
   fabricating a metal electrode on the passivation layer; and
   packaging to form a solar cell.

2. The in-situ fabrication method for solar cells of claim 1, wherein, said step (b) further includes:
   (b1) placing the silicon wafer in the implantation chamber of the plasma immersion ion implantation device and connecting said silicon wafer with a power supply electrically which can apply a bias voltage on the silicon wafer;
   (b2) adjusting process parameters of said plasma immersion ion implantation device to generate plasma having ions with etching effect and ions with passivating effect in the implantation chamber, said ions being implanted into said silicon wafer and reacted with said silicon wafer to form the black silicon;
   (b3) keeping the black silicon in situ, and further adjusting the process parameters of said plasma immersion ion implantation device to generate plasma including miscellaneous ions in the implantation chamber and to implant doping ions from the plasma into said black silicon for forming the PN junction; and
   (b4) keeping the black silicon with the PN junction formed thereon in situ, and further adjusting the process parameters of said plasma immersion ion implantation device to generate plasma including passivating ions in the implantation chamber, the passivating ions being implanted and reacted with said black silicon to form the passivation layer.

3. The in-situ fabrication method for solar cells of claim 2, wherein said process parameters include a base pressure and work pressure of said implantation chamber, a flow of gas introduced into said implantation chamber, a speed of vacuuming said gas in said implantation chamber, composition of said gas, a composition ratio and concentration of said gas, output power and frequency of a plasma source of said plasma immersion ion implantation device, bias voltage applied by the power supply which can apply bias voltage and an implanting time of the plasma.

4. The in-situ fabrication method for solar cells of claim 3, wherein, said bias voltage comprises a plurality of bias voltages, a concentration of the doping ions implanted into said black silicon is changed by adjusting the implanting time of the plasma, the flow and composition ratio of the gas and the output power of the plasma source or said bias voltage of said power supply.

5. The in-situ fabrication method for solar cells of claim 4, wherein, said step (b2) includes the following steps: vacuuming the implantation chamber to reach a pre-set base pressure range of $10^{-7}$ pa to 1000 pa; introducing a first process gas which includes a gas with etching effect and passivating effect into said implantation chamber, and adjusting the flow and composition ratio of the first gas to make a pressure inside said implantation chamber reach a pre-set base pressure range of $10^{-3}$ pa to 1000 pa; and
   adjusting the implanting time of said plasma, the output power of said plasma source or said bias voltage into a range set beforehand, and the plasma including ions with etching effect and passivating effect being generated in said implantation chamber; said ions with etching ions and said ions with passivating ions from the plasma being implanted into said silicon wafer and being reacted with said silicon wafer to form the black silicon; wherein said implanting time of the plasma is 1 minute to 30 minutes, and said output power range set beforehand is 1~100000 W, and said bias voltage range set beforehand is −100000~100000V.

6. The in-situ fabrication method for solar cells of claim 5, wherein, the flow of said first process gas is 1 sccm~1000 sccm; said gas with etching effect includes $SF_6$, $CF_4$, $CHF_3$, $C_4F_8$, $NF_3$, $SiF_4$, $C_2F_6$, HF, $BF_3$, $PF_3$, $Cl_2$, HCl, $SiH_2Cl_2$, $SiCl_4$, $BCl_3$ or HBr; and said gas with passivation effect includes: $O_2$, $N_2O$ or $N_2$; a volume ratio of the gas with etching effect and the gas with passivation effect is 0.01 to 100.

7. The in-situ fabrication method for solar cells of claim 5, wherein, said step (b3) includes the following steps:
 stopping introduction of said first process gas into said implantation chamber, vacuuming said implantation chamber, and keeping said black silicon in situ;
 introducing a second process gas which includes a gas containing a doping element into said implantation chamber, and adjusting a gas flow and concentration of said second gas containing the doping element in said second process gas to make pressure of said implantation chamber reach a pre-set base pressure range of $10^{-3}$ pa to 1000 pa; and
 adjusting the implanting time of said plasma, the output power of said plasma source or said bias voltage into a range set beforehand, and generating the plasma including the doping ions in said implantation chamber, and implanting said doping ions including B ions, P ions or As ions into said black silicon to form the PN junction; wherein the implantation time is 1 minute to 30 minutes, and said output power range set beforehand is 1~100000 W, and said bias voltage range set beforehand is −100000~100000V.

8. The in-situ fabrication method for solar cells of claim 7, wherein, said second gas containing doping element includes $B_2H_6$, $B(OCH_3)_3$, $B_2O_3$, BN, $BCl_3$, $BBr_3$, $BF_3$, $PH_3$, $PCl_3$, $PBr_3$, $PF_3$, $PF_5$, $P_2O_5$, $POCl_3$, $AsH_3$, $AsCl_3$, $AsF_3$ or $AsF_5$; the flow of said second process gas is 1 sccm~1000 sccm, and the concentration of said second gas containing the doping element in said second process gas is 0.01% to 100%.

9. The in-situ fabrication method for solar cells of claim 8, wherein, said second gas containing the doping element includes $H_2S$, $H_2Se$ or $H_2Te$; said doping ions include S ion, Se ion or Te ion.

10. The in-situ fabrication method for solar cells of claim 7, wherein, said step (b4) includes the following steps:
 stopping introduction of said second process gas into said implantation chamber, vacuuming said implantation chamber, and keeping said black silicon on which the PN junction is formed in situ;
 introducing a third process gas which includes a gas with passivating effect into said implantation chamber, and adjusting a gas flow of the third process gas to make pressure of said implantation chamber reach a pre-set base pressure range of $10^{-3}$ pa to 1000 pa; and
 adjusting the implanting time of said plasma, the output power of said plasma source or said bias voltage into a range set beforehand, and generating the plasma including ions with passivating effect in said implantation chamber; and implanting said ions with passivating effect into said black silicon to form the passivation layer; wherein the implantation time is 1 minute to 30 minutes, and said output power range set beforehand is 1~100000 W, and said bias voltage range set beforehand is −100000~100000V.

\* \* \* \* \*